(12) United States Patent
Sakano

(10) Patent No.: US 6,982,612 B2
(45) Date of Patent: Jan. 3, 2006

(54) DUPLEXER AND COMMUNICATION APPARATUS WITH A MATCHING CIRCUIT INCLUDING A TRAP CIRCUIT FOR HARMONIC SUPPRESSION

(75) Inventor: Kiwamu Sakano, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 30 days.

(21) Appl. No.: 10/725,877

(22) Filed: Dec. 2, 2003

(65) Prior Publication Data

US 2004/0119562 A1    Jun. 24, 2004

(30) Foreign Application Priority Data

Dec. 18, 2002  (JP) .............................. 2002-365968

(51) Int. Cl.
*H03H 9/70* (2006.01)
*H03H 9/72* (2006.01)

(52) U.S. Cl. ...................... 333/133; 333/126; 333/129; 333/132

(58) Field of Classification Search ........ 333/124–137, 333/193–196
See application file for complete search history.

(56) References Cited

U.S. PATENT DOCUMENTS

| 5,023,866 | A | | 6/1991 | De Muro ..................... 370/278 |
| 5,095,285 | A | * | 3/1992 | Khatibzadeh ............... 330/306 |
| 5,515,015 | A | | 5/1996 | Nakata ........................ 333/132 |
| 5,939,939 | A | * | 8/1999 | Gaynor et al. .......... 330/124 R |
| 6,489,861 | B2 | * | 12/2002 | Noguchi et al. ............ 333/133 |
| 6,577,199 | B2 | * | 6/2003 | Dent .......................... 330/302 |
| 6,608,534 | B2 | * | 8/2003 | Kushitani et al. ........... 333/126 |
| 6,781,479 | B2 | * | 8/2004 | Ikada et al. ................. 333/133 |
| 2003/0011443 | A1 | | 1/2003 | Liu ............................. 333/126 |

FOREIGN PATENT DOCUMENTS

| EP | 0 667 685 | 2/1995 |
| GB | 2 271 487 | 4/1994 |
| JP | 06-350307 | 12/1994 |
| JP | 07-226607 | 8/1995 |
| JP | 2001-127663 | 5/2001 |
| JP | 2001-352271 | 12/2001 |

* cited by examiner

*Primary Examiner*—Barbara Summons
(74) *Attorney, Agent, or Firm*—Keating & Bennett, LLP

(57) ABSTRACT

A duplexer includes a transmitting filter and a receiving filter which are connected in parallel to an antenna terminal, and a matching circuit connected between the antenna terminal and at least one of the transmitting filter and the receiving filter. A portion of the matching circuit defines a trap circuit for harmonic suppression.

18 Claims, 12 Drawing Sheets

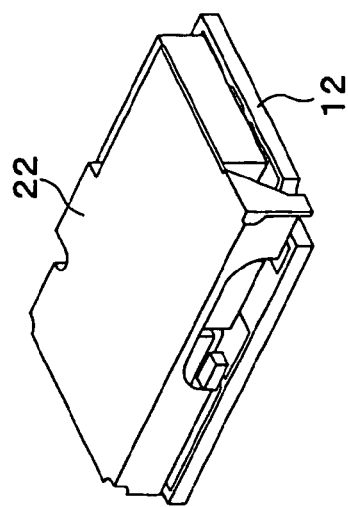
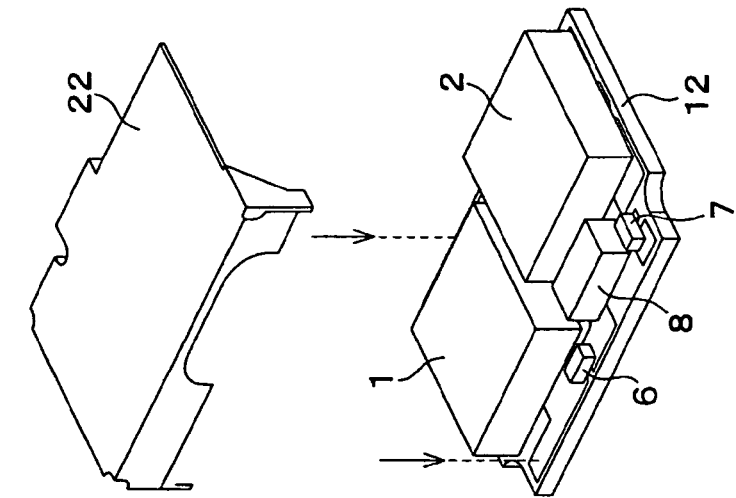
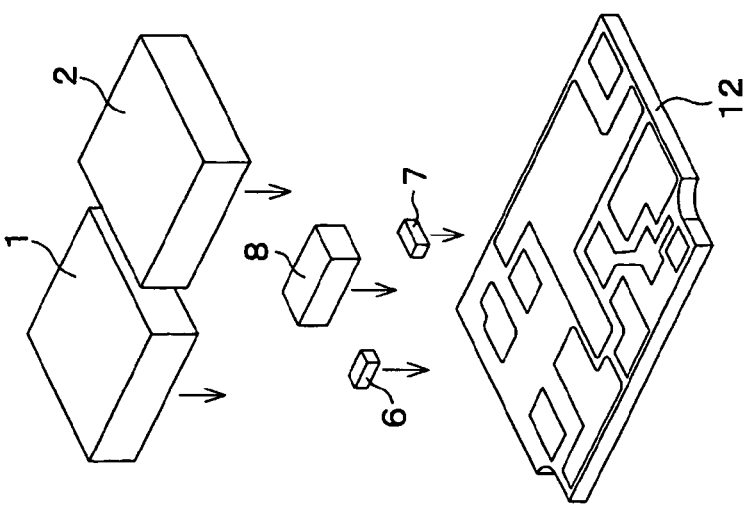
FIG. 4C
FIG. 4B
FIG. 4A

DUPLEXER AND COMMUNICATION APPARATUS WITH A MATCHING CIRCUIT INCLUDING A TRAP CIRCUIT FOR HARMONIC SUPPRESSION

BACKGROUND OF THE INVENTION

1. Field of the Invention

The present invention relates to a branching filter (duplexer) using a surface acoustic wave (SAW) filter, and more particularly, to a branching filter which provides harmonic suppression and high surge resistance without increasing the number of components and the size of the device, and also relates to a communication apparatus including the duplexer.

2. Description of the Related Art

With the recent popularity of mobile communication devices, such as cellular phones, the demand for thinner and smaller cellular phones with stable operation, e.g., with fewer malfunctions over time, has increased.

Such cellular phones share an antenna between the transmitter and the receiver in order to reduce the size. The cellular phones include a branching filter (hereinafter referred to as a duplexer or DPX) for separating a transmission high-frequency signal and a reception high-frequency signal whose center frequency is different from that of the transmission high-frequency signal. The duplexer includes a transmitting filter and a receiving filter which are connected to the antenna.

FIG. 11 shows a duplexer 50. As described in, for example, Japanese Unexamined Patent Application Publication No. 6-350307, the duplexer 50 includes a low-pass filter between, for example, an antenna (ANT) and a receiving (Rx) filter 52, defining a matching circuit for suppressing mutual interference between the transmitter (Tx) side and the receiver (Rx) side. The low-pass filter has a three-section structure including parallel capacitors 57 and 59 and a series inductor 58.

The matching circuit of the duplexer 50 makes the impedance of the Rx filter 52 infinite at the frequencies of the other filter for the antenna, i.e., the passband frequencies of a transmitting (Tx) filter 51. The matching circuit also minimizes change in the impedance of one of the filters at the passband frequencies of the other filter when the filters are connected to, thus, suppress mutual interference.

The duplexer is also required for suppressing harmonics, particularly, second and third harmonics. FIG. 12 is a circuit block diagram of a typical cellular phone. In the cellular phone, a power amp (PA) 61 is connected to an input terminal of a Tx filter 51 of a duplexer 50, and communication signal harmonics are caused by the characteristic of the PA 61. Such harmonics are also emitted from the antenna which thus causes noise. In order to overcome this problem, in the related art, an isolator is connected between the input terminal of the Tx filter 51 and the PA 61 at a location indicated by a dotted circle 63.

In order to support high-passband filters for use in cellular phones, use of compact surface acoustic wave filters (hereinafter referred to as SAW filters) has been considered. In the SAW filters, a plurality of interdigital transducers (hereinafter referred to as IDTs) having a plurality of interdigitated electrode fingers are provided on a piezoelectric substrate in the SAW propagation direction. Preferably, the SAW filters further include reflectors on both (right and left) sides of each IDT in the SAW propagation direction.

However, duplexers using a SAW filter also have a problem in that harmonics (second, third, . . . , nth harmonics) at the passband frequencies pass through the SAW filter because of its structure. The harmonics input from the PA 61 also passes through the SAW filter which leads to noise.

Another problem is that the electrode pitch of the SAW filter is very narrow, such as submicron to 2 $\mu$m, which results in low surge resistance. Incoming static electricity from the antenna during cellular phone use can damage the SAW filter, and ESD (electrostatic discharge) protection is therefore required.

When the above-described duplexer shown in Japanese Unexamined Patent Application Publication No. 6-350307 uses SAW filters as the Tx filter 51 and the Rx filter 52 in order to reduce the duplexer size, an additional isolator is required between the Tx filter 51 and the PA 61 to suppress a harmonic input from the PA 61 to the Tx filter 51, or an additional isolator is required between the antenna and the Tx filter 51 to suppress a harmonic in this SAW filter. If the duplexer includes an additional protection circuit for improving the surge resistance of the SAW filters, the number of components, such as the isolator and the protection circuit, increases and the duplexer size inevitably increases.

Japanese Unexamined Patent Application Publication No. 7-226607 discloses a duplexer using a SAW filter in which a strip line (matching circuit) provided in an internal layer of a multi-layer dielectric substrate is connected to a SAW filter provided on the principal surface of the substrate via a via hole. The duplexer disclosed in this publication does not provide ESD protection.

Japanese Unexamined Patent Application Publication No. 2001-352271 discloses an electrostatic protection circuit which is connected to an antenna of a mobile communication apparatus. In this publication, a parallel-connected transmission line permits incoming static electricity from an antenna to escape to a ground, which prevents failure caused by electrostatic discharge. However, this electrostatic protection circuit does not provide harmonic suppression, and thus, requires an additional trap circuit for harmonic suppression.

Japanese Unexamined Patent Application Publication No. 2001-127663 discloses that a circuit which is defined by a parallel inductor and a series capacitor and which is connected between an antenna and a filter is added to a high-frequency switching module for electrostatic protection. In this publication, a multi-layer substrate is used in order to prevent an increase in the size of the circuit because of the space required for the additional circuit. In this structure, a trap circuit for harmonic suppression and a circuit for electrostatic protection are separately required, thus increasing the number of components.

SUMMARY OF THE INVENTION

To overcome the problems described above, preferred embodiments of the present invention provide a duplexer which provides harmonic suppression and high surge resistance without increasing the number of components or the size.

In a preferred embodiment of the present invention, a duplexer includes a transmitting (Tx) filter and a receiving (Rx) filter which are connected in parallel to an antenna terminal, and a matching circuit between the antenna terminal and at least one of the Tx filter and the Rx filter, wherein a portion of the matching circuit functions as a trap circuit for harmonic suppression.

The matching circuit prevents mutual interference between the Tx filter and the Rx filter when the antenna is shared between the transmitter and the receiver. Therefore, a communication apparatus including the duplexer is compact due to the shared antenna, and achieves stable transmission and reception properties.

Since a portion of the matching circuit functions as a trap circuit for harmonic suppression, harmonics are suppressed without the need for any additional component, such as an isolator of the related art.

In the duplexer, the trap circuit preferably includes at least one open stub corresponding to a harmonic to be suppressed. The open stub is preferably built in, for example, a multi-layer substrate, which reduces the size of the duplexer.

The matching circuit preferably includes a parallel inductor connected between the antenna terminal and a ground. The parallel inductor is used to control the capacitance of the matching circuit, and the desired characteristics of the matching circuit are therefore achieved. Moreover, if a high voltage surge current, such as electrostatic discharge, is applied to the antenna, the parallel inductor permits the escape of the surge current to the ground, and the Rx filter is protected from the surge current. The surge resistance is therefore greatly improved.

In the passband of the Tx filter and the Rx filter, preferably, the open stub is capacitive and the combined reactance of the open stub and the parallel inductor is capacitive. This facilitates control of the characteristics of the matching circuit.

Preferably, the parallel inductor has a Q factor of about 20 or more. Such a high-Q parallel inductor improves the characteristics, such as insertion loss, of the duplexer.

Preferably, the matching circuit includes a first parallel capacitor connected to the antenna terminal, a series inductor, and a second parallel capacitor, and the first parallel capacitor includes the trap circuit.

The duplexer includes a package for housing the Tx filter and the Rx filter or a package for housing each of the Tx filter and the Rx filter, and a multi-layer substrate including the package and a portion of the matching circuit mounted thereon. Since a portion of the matching circuit is mounted on the multi-layer substrate, advantageously, the matching circuit is easily controlled, and a high-Q inductor is used for the matching circuit.

The trap circuit is preferably built in the multi-layer substrate. The trap circuit built in the multi-layer substrate further reduces the size of the duplexer.

The parallel inductor of the matching circuit is preferably a chip coil or a high-Q inductor, which is advantageous for the characteristics.

The parallel inductor of the matching circuit is preferably a short stub which is built in the multi-layer substrate. This further reduces the size of the duplexer.

The duplexer preferably includes a package for housing the Tx filter and the Rx filter, and this package also preferably houses the matching circuit. This also reduces the size of the duplexer.

The parallel inductor of the matching circuit is preferably a spiral microstrip line. In the duplexer, each of the Tx filter and the Rx filter is preferably a surface acoustic wave (SAW) filter. In the duplexer, the Tx filter is preferably a ladder-type SAW filter having a first series SAW resonator connected to the antenna. Each of the Tx filter and the Rx filter is a SAW filter which improves the surge resistance.

According to another preferred embodiment of the present invention, a communication apparatus includes the duplexer having the above-described structures.

The above and other elements, characteristics, features, steps and advantages of the present invention will become clear from the following description of preferred embodiments taken in conjunction with the accompanying drawings.

BRIEF DESCRIPTION OF THE DRAWINGS

FIGS. 4A through 4C are external perspective views of the duplexer, showing the assembly procedure;

DETAILED DESCRIPTION OF PREFERRED EMBODIMENTS

Preferred embodiments of the present invention will now described with reference to FIGS. 1A through 10B.

First Preferred Embodiment

Figure 1A:
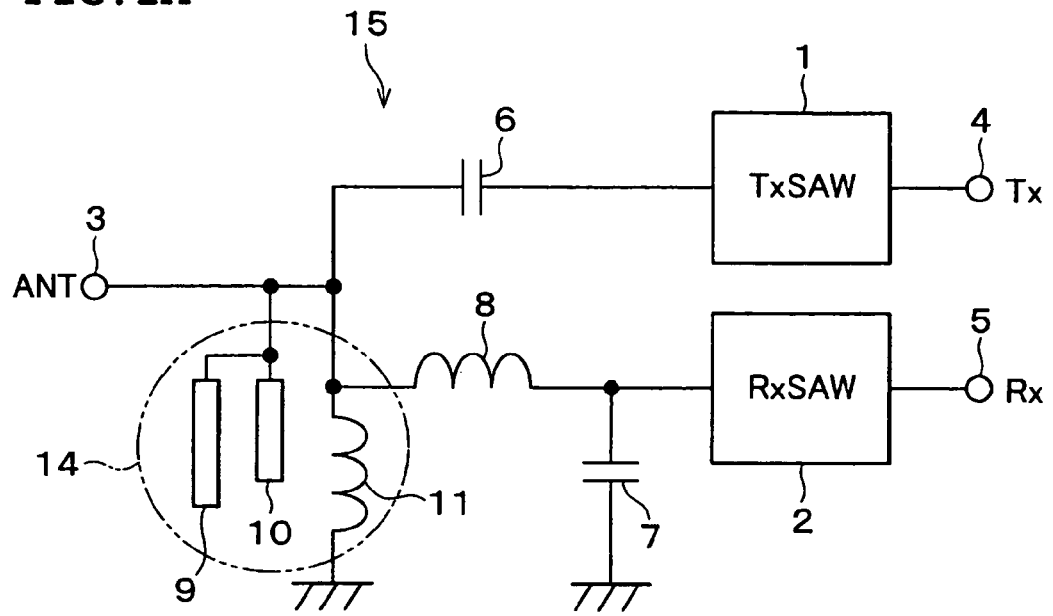
FIG. 1A is a circuit block diagram of a duplexer according to a first preferred embodiment of the present invention.
Figure 1B:
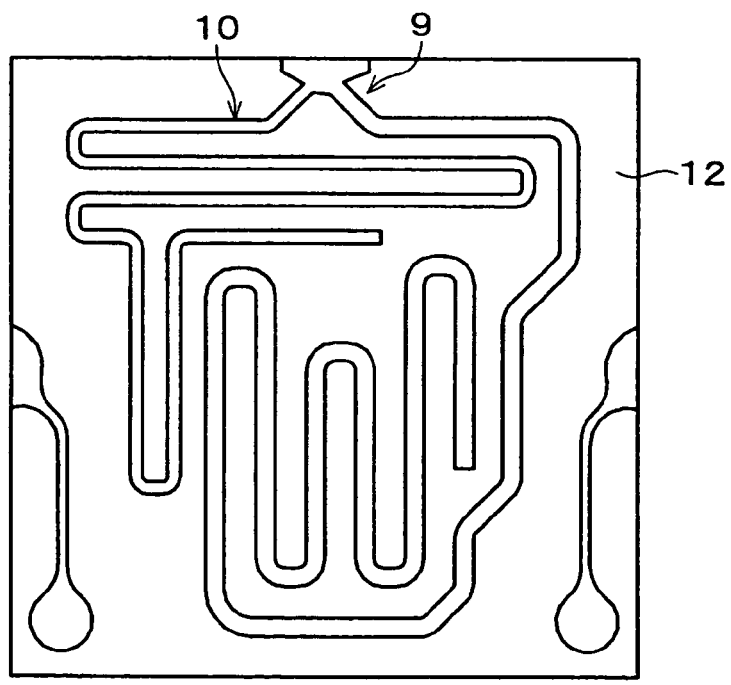
FIG. 1B is a plan view of open stubs of the duplexer.
Figure 2C:
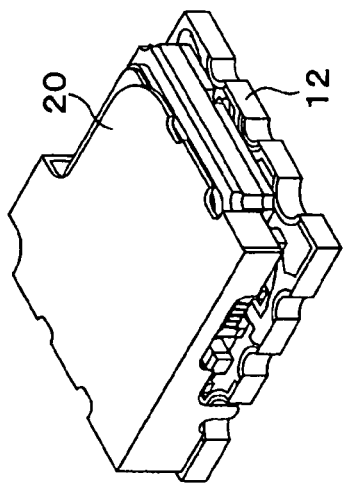
FIGS. 2A through 2C are external perspective views of the duplexer, showing the assembly procedure.
Figure 2B:
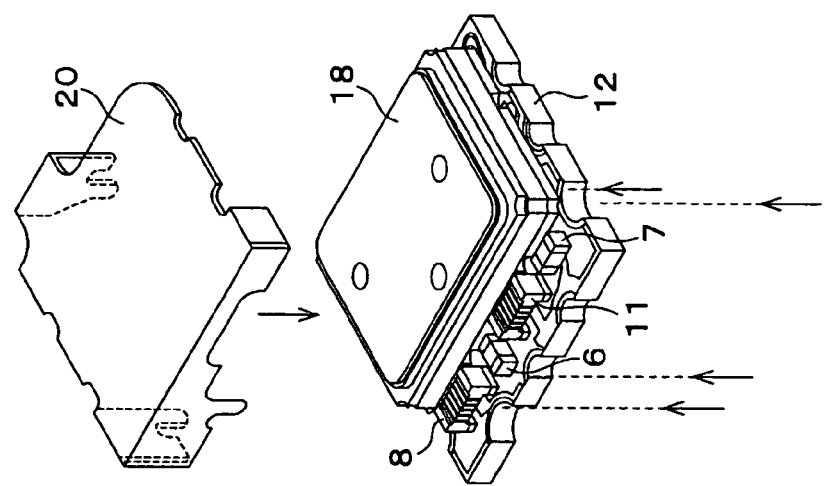
Figure 2A:
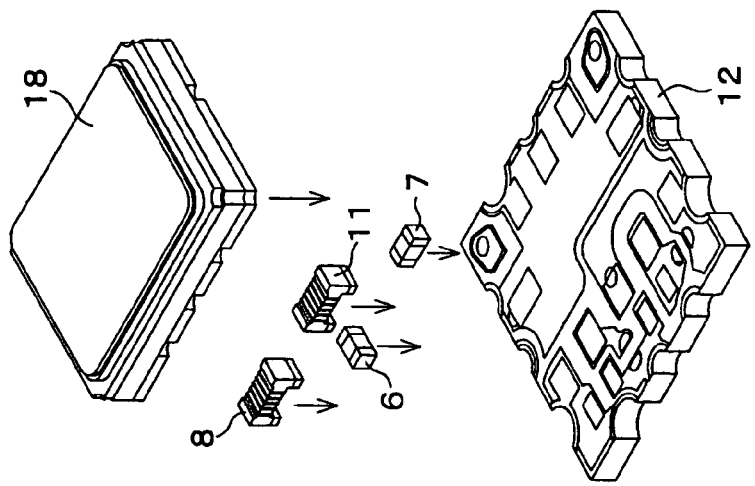

FIG. 1A is a circuit diagram of a duplexer according to a first preferred embodiment of the present invention, and FIG. 1B is a plan view of open stubs of the duplexer. FIGS. 2A through 2C are external perspective views of the duplexer according to the first preferred embodiment, showing the assembly procedure.

As shown in FIG. 1A, the duplexer includes an input terminal 4 to which a transmission (Tx) signal is input, an output terminal 5 from which a received (Rx) signal is output, and an antenna (ANT) terminal 3 defining a shared input/output terminal to which the transmission signal is input and from which the received signal is output.

The duplexer further includes Tx-signal and Rx-signal band-pass filters (BPFs), which are defined by T-shaped ladder SAW filters each having series resonators on the input and output sides, respectively, namely, a Tx SAW filter 1 and an Rx SAW filter 2.

The Tx SAW filter 1 is connected between the antenna terminal 3 and the input terminal 4. The Rx SAW filter 2 is connected between the antenna terminal 3 and the output terminal 5. The Tx SAW filter 1 and the Rx SAW filter 2 are preferably housed in a single package 18, as shown in FIGS. 2A and 2B.

As shown in FIG. 1A, the duplexer further includes a matching circuit 15 having a capacitor 6, which is connected between the antenna terminal 3 and the Tx SAW filter 1, and a first parallel capacitor 14, a series inductor 8, and a second parallel capacitor 7, which are connected between the antenna terminal 3 and the Rx SAW filter 2.

The first capacitor 14 is connected between the antenna terminal 3 and a ground. The inductor 8 is connected between the antenna terminal 3 and the Rx SAW filter 2. The second capacitor 7 is connected between the Rx SAW filter 2 and the ground.

The capacitor 6, the first capacitor 14, the inductor 8, and the second capacitor 7 define the matching circuit 15 for impedance matching. The matching circuit 15 is a circuit for matching impedance to the antenna terminal conditions. Specifically, the impedance matching circuit 15 performs impedance matching such that, at the passband frequencies of the Rx SAW filter 2, the impedance of the Tx SAW filter 1 is as open as possible and the impedance of the Rx SAW filter 2 matches the antenna terminal conditions as much as possible.

The matching circuit 15 also performs impedance matching such that, at the passband frequencies of the Tx SAW filter 1, the impedance of the Rx SAW filter 2 is as open as possible and the impedance of the Tx SAW filter 1 matches the antenna terminal conditions as much as possible.

The Tx SAW filter 1 of the duplexer must have a characteristic in which the attenuation poles are located in the passband of the Rx filter 2. On the other hand, the Rx SAW filter 2 must have a characteristic in which the attenuation poles are located in the passband of the Tx filter 1. The attenuation poles in the high-frequency range are used for attenuation in the passband of the Rx SAW filter 2.

Therefore, an attenuation pole for harmonic suppression cannot be used in the Tx SAW filter 1 and the Rx SAW filter 2 of the duplexer. One typical harmonic suppression approach is to add a trap circuit, but this is not desirable in view of size reduction.

In the first preferred embodiment, the first capacitor 14 includes open stubs (trap circuits) 9 and 10, which are defined by microstrip lines, for providing attenuation poles at the frequencies at which the second and third harmonics of the Tx band occur, respectively. The open stubs 9 and 10 provide suppression of second and third harmonics of the Tx band, respectively.

Since the open stub 9 suppresses a second harmonic and the open stub 10 suppresses a third harmonic, the open stubs 9 and 10 have different lengths, which are about one quarter wavelength ($\lambda$) of the second and third harmonics, respectively.

In general, open stubs are capacitive in the frequency range lower than the resonance point and are inductive in the frequency range higher than the resonance point. Therefore, the open stubs 9 and 10 used for harmonic suppression are capacitive at the passband frequencies.

A stub, which is also referred to as a stub resonator, is a series resonator having zero impedance with the transmission line short-circuited at a length equal to an even-numbered multiple of $\lambda/4$ (a short stub) or open at a length equal to an odd-numbered multiple of $\lambda/4$ (an open stub), or a parallel resonator an impedance of $\infty$ with the transmission line short-circuited at a length that is substantially equal to an odd-numbered multiple of $\lambda/4$ or open at a length equal to an even-numbered multiple of $\lambda/4$, where $\lambda$ indicates the wavelength of the frequency of the desired attenuation pole.

As shown in FIG. 1B, the open stubs 9 and 10 are provided in a multi-layer substrate 12. Since the microstrip lines of the open stubs 9 and 10 are provided in a layer of the multi-layer substrate 12, the multi-layer substrate 12 having the open stubs 9 and 10 is only about 50 $\mu$m thicker than and has a cross-sectional area in the plane direction thereof (i.e., the occupied area) approximate the same as the multi-layer substrate 12 without the open stubs 9 and 10. Thus, the size of the multi-layer substrate 12 is not substantially increased.

The open stubs 9 and 10 function as parallel capacitors in the passband, and the lengths of the open stubs 9 and 10 are adjusted so as to suppress the second and third harmonics of the Tx band, respectively. The capacitances of the open stubs 9 and 10 are therefore fixed.

In the duplexer, a parallel inductor 11 for capacitance control is connected between the antenna terminal 3 and the ground to obtain the desired capacitance of the first capacitor 14.

Two multi-layer capacitors defined by a first capacitor 6 and a second capacitor 7, two wound-type chip coils defined by the inductors 8 and 11, and the package 18 are surface-mounted on the multi-layer substrate 12. In particular, the parallel inductor 11 is preferably a wound-type chip coil with a Q factor of at least about 20. The chip components are connected to each other via signal lines provided in advance on the mounting surface of the multi-layer substrate 12. After the components are mounted on the surface of the multi-layer substrate 12, a metal cover 20 is mounted on the multi-layer substrate 12 so as to cover the mounted components, thereby providing the duplexer according to the first preferred embodiment.

The duplexer includes SAW filters, namely, the Tx SAW filter 1 and the Rx SAW filter 2, thus achieving size reduction. The matching circuit 15 is defined by the first parallel capacitor 14, the series inductor 8, and the second parallel capacitor 7, and the first parallel capacitor 14 is defined by the open stubs (trap circuits) 9 and 10 and the parallel inductor 11, thus achieving both harmonic suppression and electrostatic discharge (ESD) protection.

Second Preferred Embodiment

A duplexer according to a second preferred embodiment of the present invention will now be described with reference to FIGS. 3A through 4C. In the second preferred embodiment, components having similar functions to those of the first preferred embodiment are given the same reference numerals, and a description thereof is omitted.

Figure 3A:
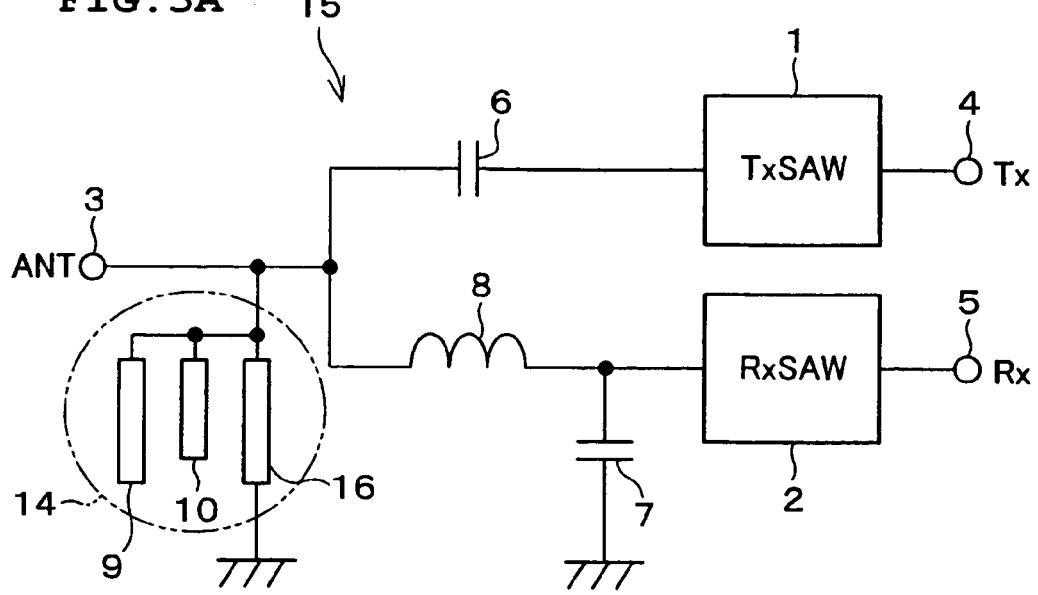
FIG. 3A is a circuit block diagram of a duplexer according to a second preferred embodiment of the present invention.

The duplexer according to the second preferred embodiment includes a microstrip-line parallel inductor 16, in place of the parallel inductor 11 defined by a wound-type chip coil in the first preferred embodiment, as shown in FIG. 3A.

The microstrip-line parallel inductor 16 which is short-circuited to a ground is also referred to as a short stub, a half-wavelength line, or a short-circuited stub, and inherently attenuates a certain characteristic frequency. In the second preferred embodiment, however, the parallel inductor 16 functions only as an inductor.

In general, short stubs are inductive at frequencies that are lower than the antiresonance point, capacitive at the frequencies from the antiresonance point to the resonance point, and inductive at frequencies that are higher than the resonance point. In the second preferred embodiment, the length of the parallel inductor 16, which is a short stub, is preferably arranged so as to be inductive in the passband of the Rx SAW filter 2.

Figure 3B:
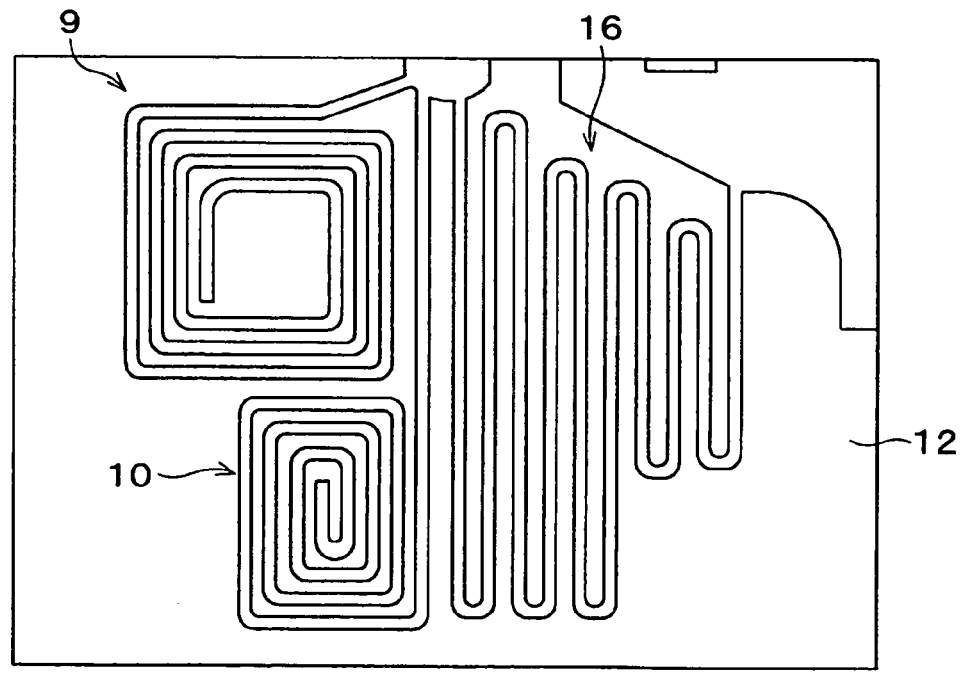
FIG. 3B is a plan view of open stubs and a parallel inductor of the duplexer.

As shown in FIG. 3B, the microstrip line of the parallel inductor 16 is provided in, for example, the same layer of the multi-layer substrate 12 as the layer in which the open stubs 9 and 10 are provided.

The microstrip line of the parallel inductor 16 may have a meandering pattern or a spiral pattern, but preferably has a spiral pattern to reduce the size thereof. One end of such a patterned microstrip line is connected with a ground pattern provided on the reverse surface of the multi-layer substrate 12 via a through hole (not shown) provided in the multi-layer substrate 12 in the thickness direction thereof. The microstrip line of the parallel inductor 16 has a resonance point in a frequency range higher than the passband. Thus, the parallel inductor 16 has an inductance component in the passband.

In the second preferred embodiment, harmonic suppression and high surge resistance are achieved while reducing the number of mounted components. Since the parallel inductor 16, which controls capacitance, is defined by a microstrip line, the microstrip line can be built in the layered structure of the multi-layer substrate 12, and the parallel inductor 16 achieves advantages similar to the parallel inductor 11 of the first preferred embodiment mounted on the surface of the multi-layer substrate 12. Moreover, the microstrip line of the parallel inductor 16 requires a smaller space, thus, reducing the size of the duplexer.

In the duplexer of the second preferred embodiment, as shown in FIGS. 4A and 4B, the capacitor 6, the second capacitor 7, the inductor 8, the Tx SAW filter 1, and the Rx SAW filter 2 are surface-mounted on the multi-layer substrate 12. These chip components are connected to each other via signal lines formed in advance on the mounting surface of the multi-layer substrate 12. After the components are mounted on the surface of the multi-layer substrate 12, a metal cover 22 is mounted on the multi-layer substrate 12 so as to cover the mounted components, thereby producing the duplexer of the second preferred embodiment.

In the second preferred embodiment, the Tx SAW filter 1 and the Rx SAW filter 2 are housed in separate packages. However, the SAW filters 1 and 2 may be housed in a single package. In the first and second preferred embodiments, each of the Tx SAW filter 1 and the Rx SAW filter 2, which are BPFs, is preferably a T-shaped ladder SAW filter having series resonators on the input and output sides. However, each of the filters 1 and 2 may be a π-shaped ladder filter beginning with a parallel resonator.

A communication apparatus, such as a cellular phone, including the above-described duplexer suppresses harmonics from the Tx SAW filter 1 via the open stubs 9 and 10, which thus greatly improves the noise performance of the apparatus.

In order to test the harmonic suppression ability using the open stubs 9 and 10, the insertion losses of the duplexer of the first preferred embodiment and a duplexer of the related art, as a comparative example, including a standard multi-layer capacitor in place of the first capacitor 14, were measured with respect to frequency. The results are shown in FIG. 5, wherein the duplexer of the first preferred embodiment is indicated by a solid line and the duplexer of the comparative example is indicated by a dotted line, and Table 1 as follows:

TABLE 1

|  | Second Harmonic (dB) | Third Harmonic (dB) |
| --- | --- | --- |
| duplexer with open stub | 13.16 | 4.59 |
| duplexer without open stub | 38.71 | 37.12 |

Figure 5:
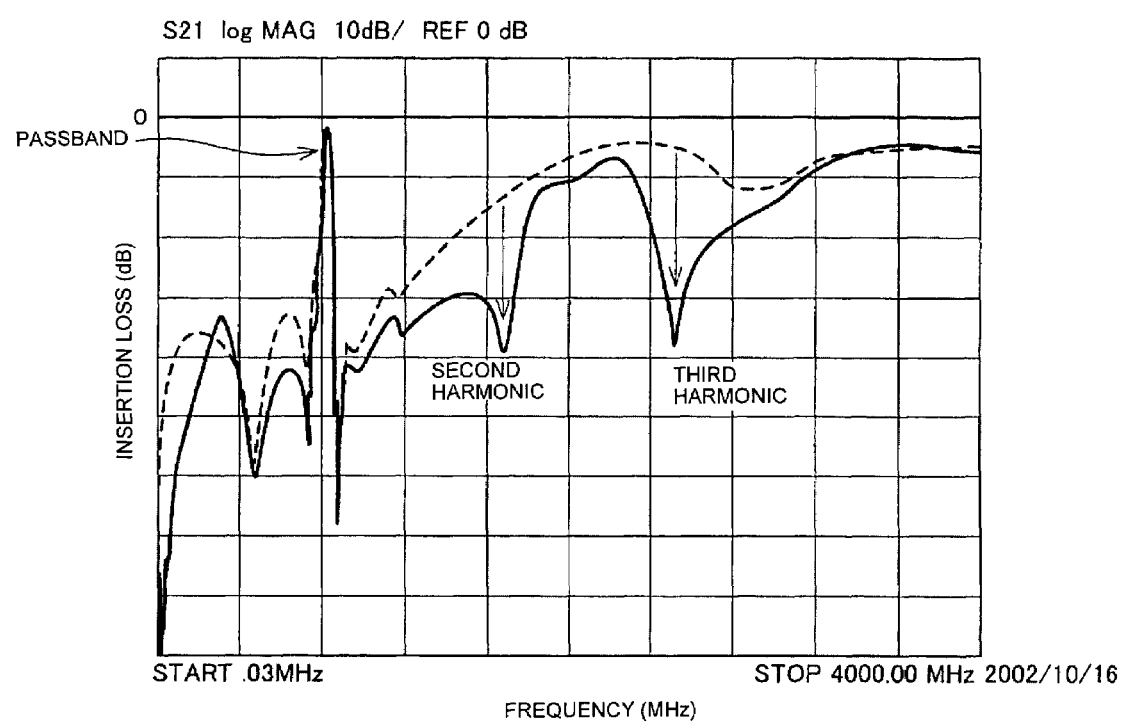
FIG. 5 is a graph showing that second and third harmonics are lowered in the duplexer of preferred embodiments of the present invention compared with a duplexer of the related art.

As shown in FIG. 5 and Table 1, the resonance points of the open stubs 9 and 10 are substantially adjusted for the wavelengths of the second and third harmonics, respectively, thereby suppressing harmonics or spurious components from a power amp or a SAW filter.

Figure 6:
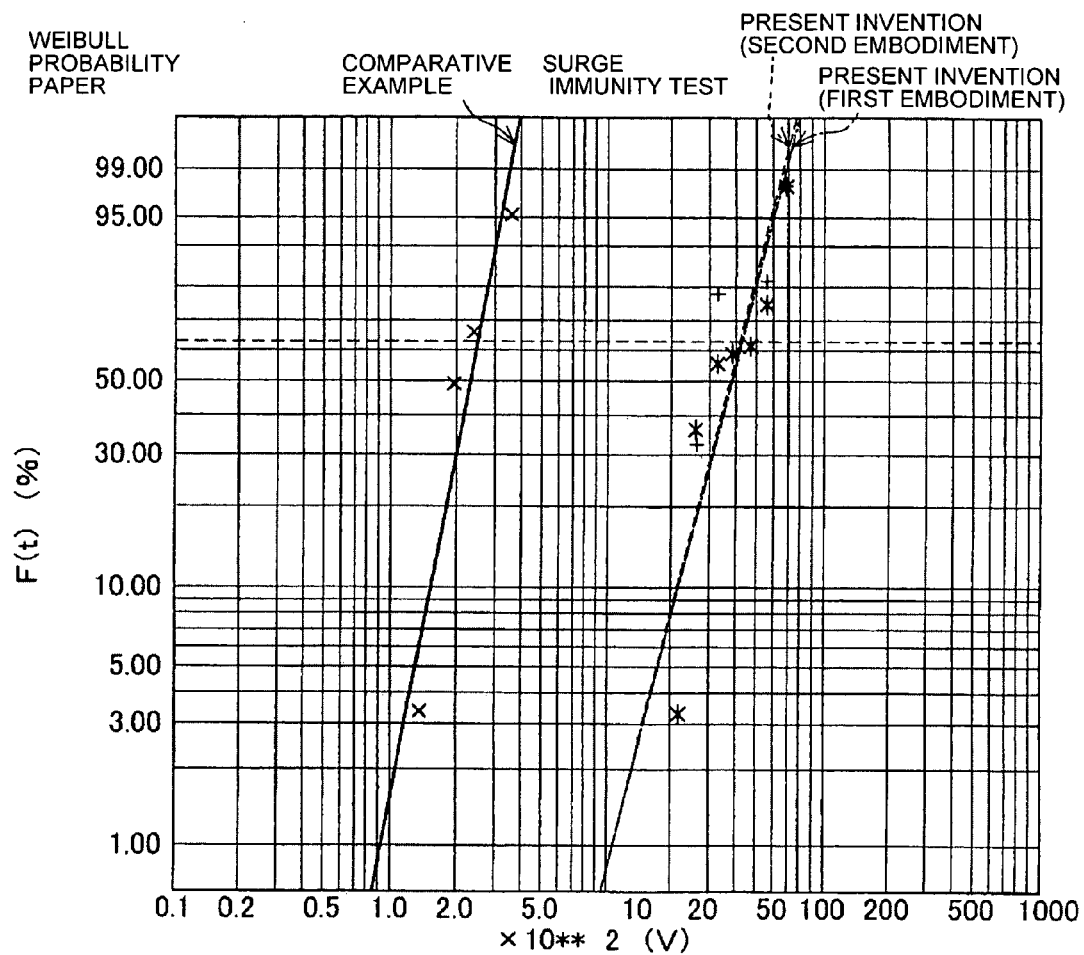
FIG. 6 is a graph showing a surge immunity test of the duplexers of the first and second preferred embodiments and the duplexer of the related art.

A surge immunity test was performed for the duplexers according to the first and second preferred embodiments of the present invention and the duplexer of the comparative example. The test results are shown in FIG. 6. The working curves plotted in FIG. 6 indicating the rate of failure caused by static electricity with respect to applied voltage are as follows:

Comparative Example: x—x, Fail/Data::30/30, γ=0.0
m(1)=4.56, $\mu$(1)=2.33e+002
Second Embodiment: +—+, Fail/Data::30/30, γ=0.0
m(1)=3.36, $\mu$(1)=3.79e+003
First Embodiment: *—*, Fail/Data::30/30, γ=0.0
m(1)=3.28, $\mu$(1)=3.95e+003 where m denotes a gradient and p denotes an applied voltage at a probability of 63%. The greater m and $\mu$, the higher the surge resistance.

As shown in FIG. 6, the duplexer according to the first and second preferred embodiments of the present invention has higher surge resistance than the duplexer of the comparative example, and provides higher electrical durability of the device, such as a cellular phone. In preferred embodiments of the present invention, the parallel inductor 11 or 16 is preferably connected between the antenna and the Tx (or Rx) side, thus permitting an incoming electrostatic surge current from the antenna to escape to the ground via the parallel inductor 11 or 16. The surge current is prevented from reaching the SAW filter, and the surge resistance greatly increases.

Since T-shaped ladder SAW filters are preferably used in the first and second preferred embodiments, a voltage applied to one resonator is dispersed, thus improving the surge resistance.

The above-described advantages, that is, harmonic suppression and high surge resistance, are achieved without increasing the duplexer size, because the open stubs 9 and 10 are defined by microstrip lines provided in the layered structure of the multi-layer substrate 12 and the space required for such microstrip lines is built in the multi-layer substrate 12, which eliminates the need to increase the surface area of the duplexer.

The duplexer of preferred embodiments of the present invention requires fewer components than a duplexer in which all the capacitors and inductors of the matching circuit 15 are defined by chips, because the open stubs 9 and 10 function as parallel capacitors in the passband, thus eliminating the need for a traditional parallel capacitor defined by a chip, such as a multi-layer capacitor. The capacitance generated by the open stubs 9 and 10 is controlled by the mounted parallel inductor. Therefore, the number of required components is not increased.

Figure 7:
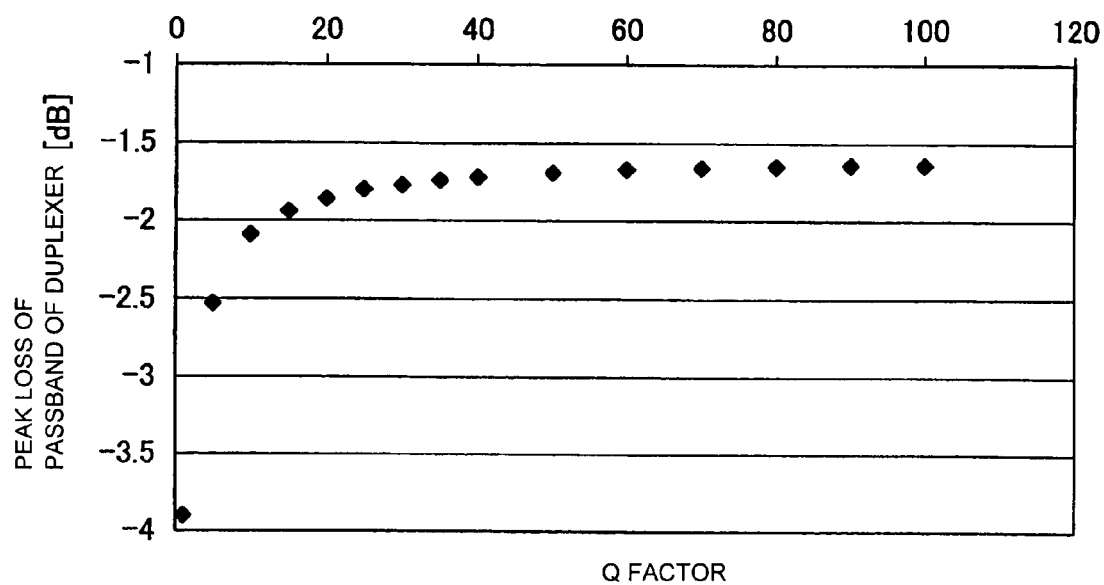
FIG. 7 is a graph showing a change of insertion loss of the duplexer of the first preferred embodiment when the Q factor of the parallel inductor varies.
Figure 8:
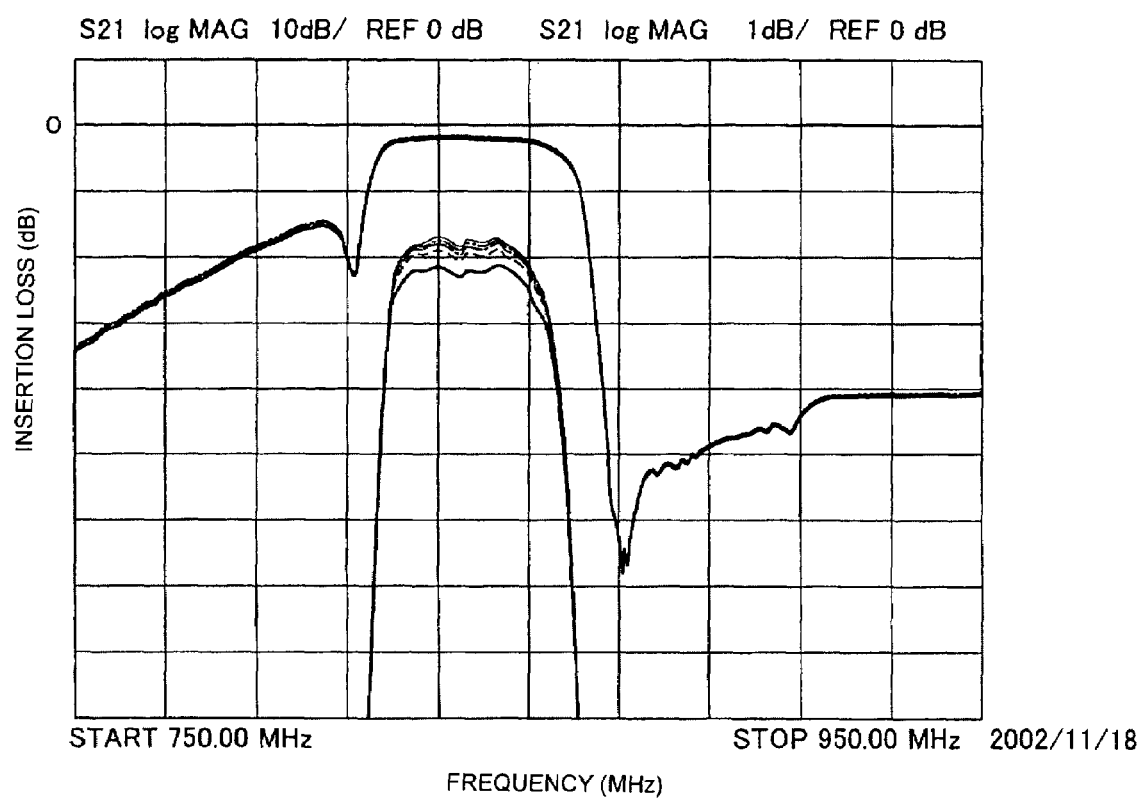
FIG. 8 is a graph showing a change of insertion loss of the duplexer of the first preferred embodiment when the Q factor of the parallel inductor varies.

The insertion loss of the duplexer of preferred embodiments of the present invention was measured when the Q factor of the parallel inductor varied in a range of about 1 to about 100. The results are shown in FIGS. 7 and 8. It was found that the Q factor of the parallel inductor was preferably at least about 20. Generally, wound-type chip coil components have a higher Q factor than microstrip-line inductors. Therefore, it is more beneficial that the parallel inductor be defined by a wound-type chip coil component in view of the minimal degradation of the insertion loss of the duplexer.

Figure 9:
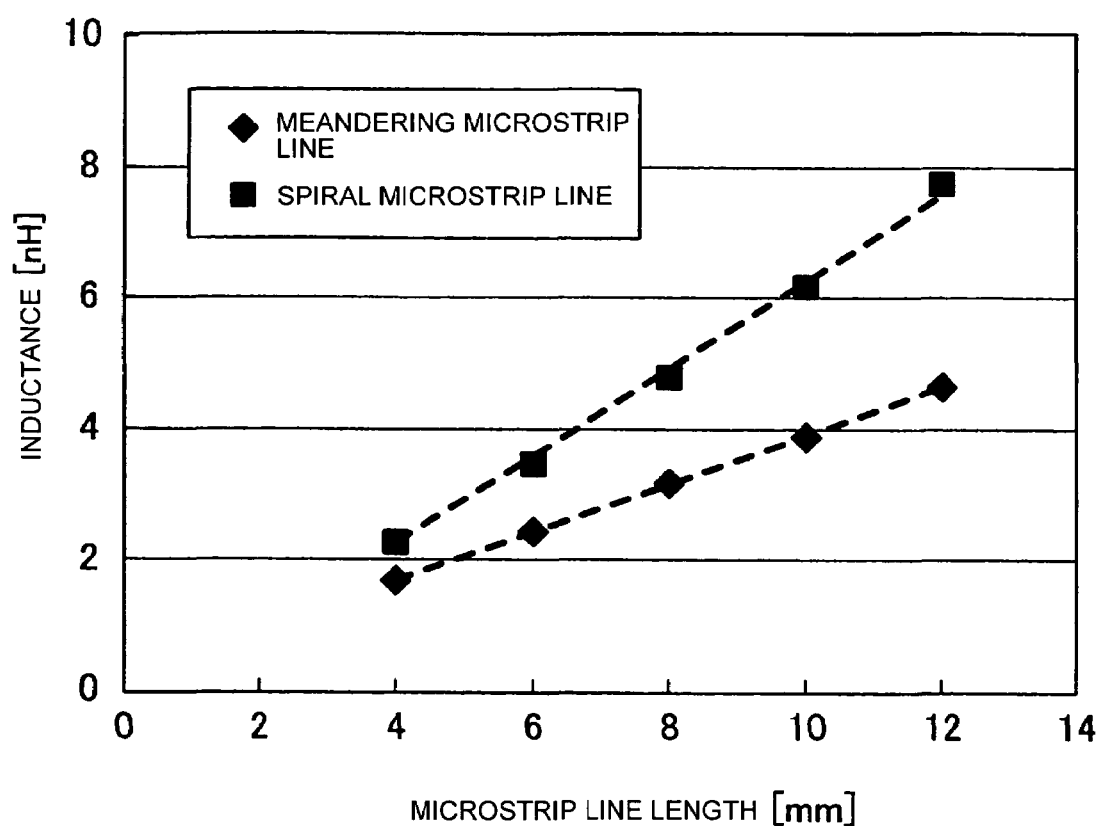
FIG. 9 is a graph showing the relationship between the microstrip line length of the duplexer and the inductance in terms of spiral pattern and meandering pattern.
Figure 10A:
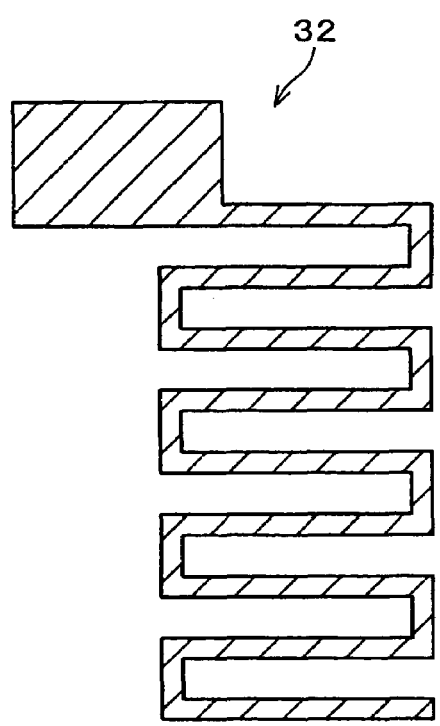
FIG. 10A is a plan view of a meandering microstrip line.
Figure 10B:
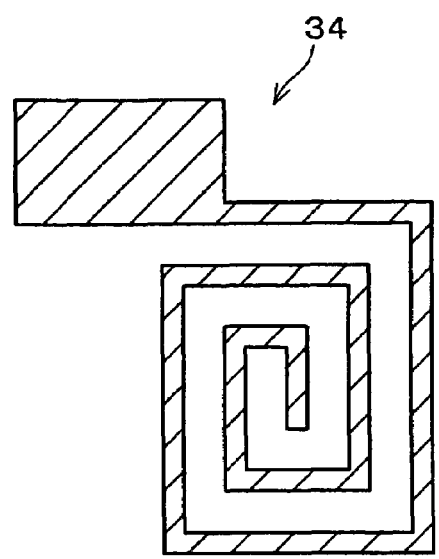
FIG. 10B is a plan view of a spiral microstrip line.
Figure 11:
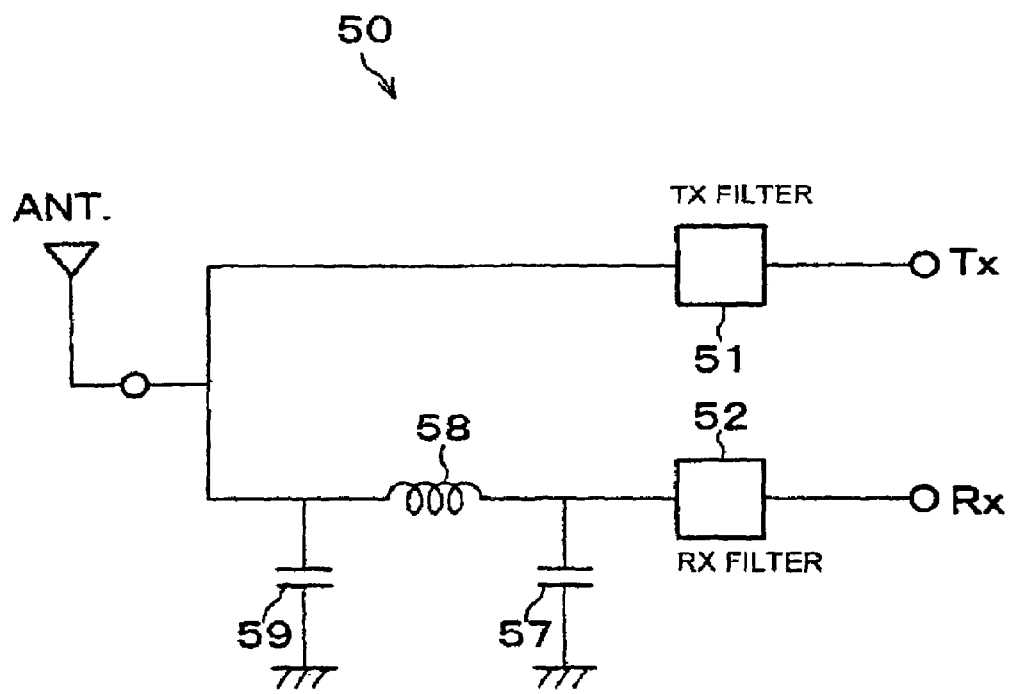
FIG. 11 is a circuit block diagram of a duplexer of the related art.
Figure 12:
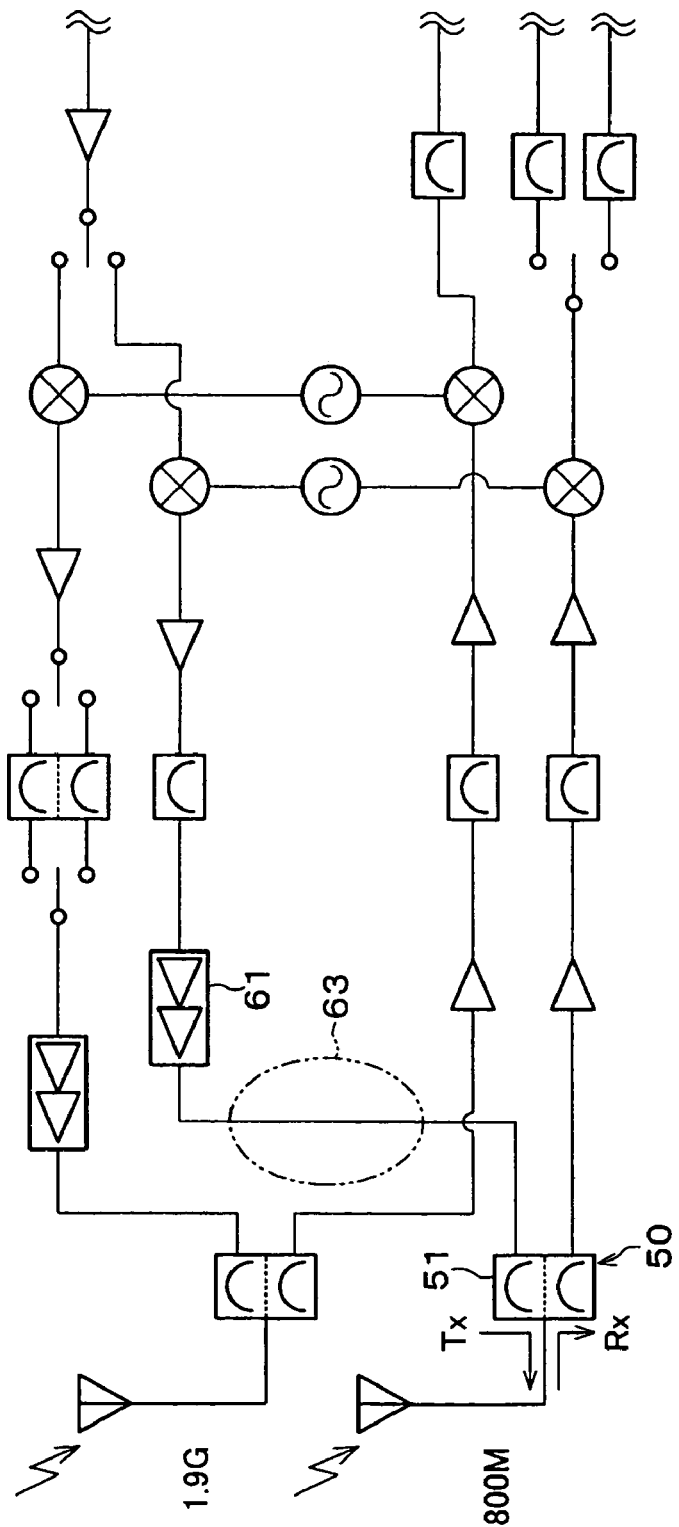
FIG. 12 is a circuit block diagram of a cellular phone of the related art.

FIG. 9 shows the relationship between the inductance and the microstrip line length when the microstrip line of the duplexer is a meandering microstrip line 32 shown in FIG. 10A and when the microstrip line is a spiral microstrip line 34 shown in FIG. 10B. The spiral microstrip line 34 has a shorter pattern length than the meandering microstrip line 32, and thus, requires a smaller space.

In the spiral microstrip line 34, a signal flows in adjacent line portions in the same direction, thus making it difficult to cancel the magnetic fields generated by the current. In the meandering microstrip line 32, on the other hand, a signal flows in adjacent line portions in opposite directions, thus, making it possible to easily cancel the magnetic fields generated by the current. The spiral microstrip line 34 generates lower magnetic coupling, and has lower inductance loss caused by the magnetic coupling. Therefore, the spiral microstrip line 34 has a shorter pattern length.

In a preferred embodiment of the duplexer disclosed in Japanese Unexamined Patent Application Publication No. 7-226607, an attenuation pole is defined by an open stub. However, the duplexer disclosed in this publication includes a matching circuit having a different structure from that of the present invention.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A duplexer comprising:
   a transmitting filter and a receiving filter which are connected in parallel to an antenna terminal; and
   a matching circuit provided between the antenna terminal and at least one of the transmitting filter and the receiving filter; wherein
   a portion of the matching circuit defines a trap circuit for harmonic suppression;
   the trap circuit includes at least one open stub corresponding to a harmonic to be suppressed;
   the matching circuit includes a parallel inductor connected between the antenna terminal and a ground; and
   the parallel inductor is a wound-type chip coil.

2. A duplexer according to claim 1, further comprising a package for housing the transmitting filter and the receiving filter, wherein the package also houses the matching circuit.

3. A duplexer according to claim 1, wherein each of the transmitting filter and the receiving filter includes a surface acoustic wave filter.

4. A duplexer according to claim 1, wherein the transmitting filter includes a ladder-type SAW filter having a first series SAW resonator connected to the antenna side.

5. A duplexer according to claim 4, wherein the ladder-type SAW filter is a T-shaped ladder SAW filter.

6. A communication apparatus comprising the duplexer according to claim 1.

7. A duplexer according to claim 1, wherein the parallel inductor has a Q factor of at least about 20.

8. A duplexer according to claim 1, wherein, in a passband of the transmitting filter and the receiving filter, the open stub is capacitive and the combined reactance of the open stub and the parallel inductor is capacitive.

9. A duplexer comprising:
   a transmitting filter and a receiving filter which are connected in parallel to an antenna terminal; and
   a matching circuit provided between the antenna terminal and at least one of the transmitting filter and the receiving filter,
   at least one package for housing at least one of the transmitting filter and the receiving filter; and
   a multi-layer substrate having the package and a portion of the matching circuit mounted thereon; wherein
   a portion of the matching circuit defines a trap circuit for harmonic suppression;
   the matching circuit includes a parallel inductor connected between the antenna terminal and a ground; and
   the parallel inductor of the matching circuit includes a chip coil.

10. A duplexer according to claim 9, wherein the trap circuit includes at least one open stub corresponding to a harmonic to be suppressed.

11. A duplexer according to claim 10, wherein, in a passband of the transmitting filter and the receiving filter, the open stub is capacitive and the combined reactance of the open stub and the parallel inductor is capacitive.

12. A duplexer according to claim 9, wherein the parallel inductor has a Q factor of at least about 20.

13. A duplexer according to claim 9, wherein each of the transmitting filter and the receiving filter includes a surface acoustic wave filter.

14. A duplexer according to claim 9, wherein the transmitting filter includes a ladder-type SAW filter having a first series SAW resonator connected to the antenna side.

15. A duplexer according to claim 14, wherein the ladder-type SAW filter is a T-shaped ladder SAW filter.

16. A duplexer according to claim 9, wherein the matching circuit includes a first parallel capacitor connected to the antenna terminal, a series inductor, and a second parallel capacitor, and the first parallel capacitor includes the trap circuit.

17. A communication apparatus comprising the duplexer according to claim 9.

18. A duplexer according to claim 9, wherein the trap circuit is provided in the multi-layer substrate.

* * * * *